United States Patent [19]

Nakagawa et al.

[11] Patent Number: 4,930,104
[45] Date of Patent: May 29, 1990

[54] CONTENT-ADDRESSED MEMORY

[75] Inventors: Norio Nakagawa, Kodaira; Katsuaki Takagi, Higashimurayama; Hirokazu Aoki, Hachiohji, all of Japan

[73] Assignee: Hitachi, Ltd., Tokyo, Japan

[21] Appl. No.: 349,402

[22] Filed: May 8, 1989

Related U.S. Application Data

[63] Continuation of Ser. No. 909,928, Sep. 22, 1986, Pat. No. 4,831,586.

[30] Foreign Application Priority Data

Sep. 20, 1985 [JP] Japan ............................ 60-206420

[51] Int. Cl.⁵ ................ G11C 13/00; G11C 11/40
[52] U.S. Cl. ...................... 365/49; 365/189.01; 365/230.01
[58] Field of Search ............... 365/49, 189, 207, 230, 365/189.01, 230.01

[56] References Cited

U.S. PATENT DOCUMENTS

| | | | |
|---|---|---|---|
| 3,249,921 | 5/1966 | Seeber | 365/49 |
| 3,868,642 | 2/1975 | Sachs | 365/49 |
| 4,045,781 | 8/1977 | Levy et al. | 365/49 |

Primary Examiner—Terrell W. Fears
Attorney, Agent, or Firm—Antonelli, Terry, Stout & Kraus

[57] ABSTRACT

A content-addressed memory which has a priority ranking circuit and/or a write control circuit provided in an output section thereof, the priority ranking circuit being adapted to be selectively operated so as to selectively output only one hit signal and the write control circuit being adapted to receive a hit signal and allow a corresponding memory cell to be brought into a write enable state.

9 Claims, 3 Drawing Sheets

CONTENT-ADDRESSED MEMORY

This application is a continuation of application Ser. No. 909,928 filed Sept. 22, 1986 and now U.S. Pat. No. 4,831,586.

BACKGROUND OF THE INVENTION

The present invention relates to a content-addressed memory. More particularly, the present invention pertains to a technique which may be utilized effectively in an associative memory constituted by, for example, a one-chip semiconductor integrated circuit.

The content-addressed memory, which is one type of associative memory, is adapted to effect the following associative operation. Input data, which consists of a plurality of bits, includes a data code (key) constituted by a part of the input data, that is, any desired several bits therein. This input data is input after it has been made invalid (masked) except for the key portion. The input key is compared with bits (keys of stored data) corresponding to input keys of all the data stored in the associative memory. As a result, stored data which has the same key as the input key is output as data associated with the input data (see, e.g., the Oct. 27, 1980, issue of "Nikkei Electronics", Nikkei-McGraw-Hill, pp. 103 to 135).

The content-addressed memory greatly differs from ordinary memories in that stored data items are accessed by their contents (keys) rather than their specific addresses in memory. More specifically, the content-addressed memory operates such that an input key is logically compared with each of the stored data, and a flag (a hit flag) is set on stored data which satisfies particular associative conditions. In an associative memory, a static RAM in which there has been stored the data associated with the input data is automatically selected by the above-described hit flag, and the associated data is thereby output.

Thus, management of keys is very important in the use of an associative memory provided with a content-addressed memory. More specifically, if a plurality of data items respectively including keys with the same bit pattern are stored in an associative memory, multiple selection of memory locations may occur, that is, two or more memory locations may be undesirably selected at the same time. This must be taken into full consideration, particularly, when a specific bit in a key is masked. When a single associative memory is used for execution of a plurality of programs, if a key which has been used for a previous program is left in the content-addressed memory, there is a possibility of two or more keys having the same bit pattern being provided as in the case described above. If such multiple keys are stored in the content-addressed memory, multiple selection of storage locations may undesirably take place, resulting in destruction of data stored in the memory. Accordingly, it is necessary to effect processing, such as clearing of the contents of the content-addressed memory, before the program is executed.

As described above, management of keys is extremely troublesome in the operation of an associative memory wherein data corresponding to one key is taken out using a content-addressed memory.

SUMMARY OF THE INVENTION

Accordingly, it is a primary object of the present invention to provide a content-addressed memory which is so designed that management of keys is facilitated.

A representative of the novel techniques disclosed in this application will be briefly described below.

A priority ranking circuit and/or a write control circuit is provided in an output section of a content-addressed memory, the priority circuit being selectively operated so as to selectively output only one hit signal, and the control circuit is adapted to receive a hit signal from the content-addressed memory and allow a corresponding memory cell in the content-addressed memory to be brought into a write enable state.

BRIEF DESCRIPTION OF THE DRAWINGS

The above and other objects, novel features and advantages of the present invention will become apparent from the following description of the preferred embodiment thereof, taken in conjunction with the accompanying drawings.

DESCRIPTION OF THE PREFERRED EMBODIMENT

Figure 1:
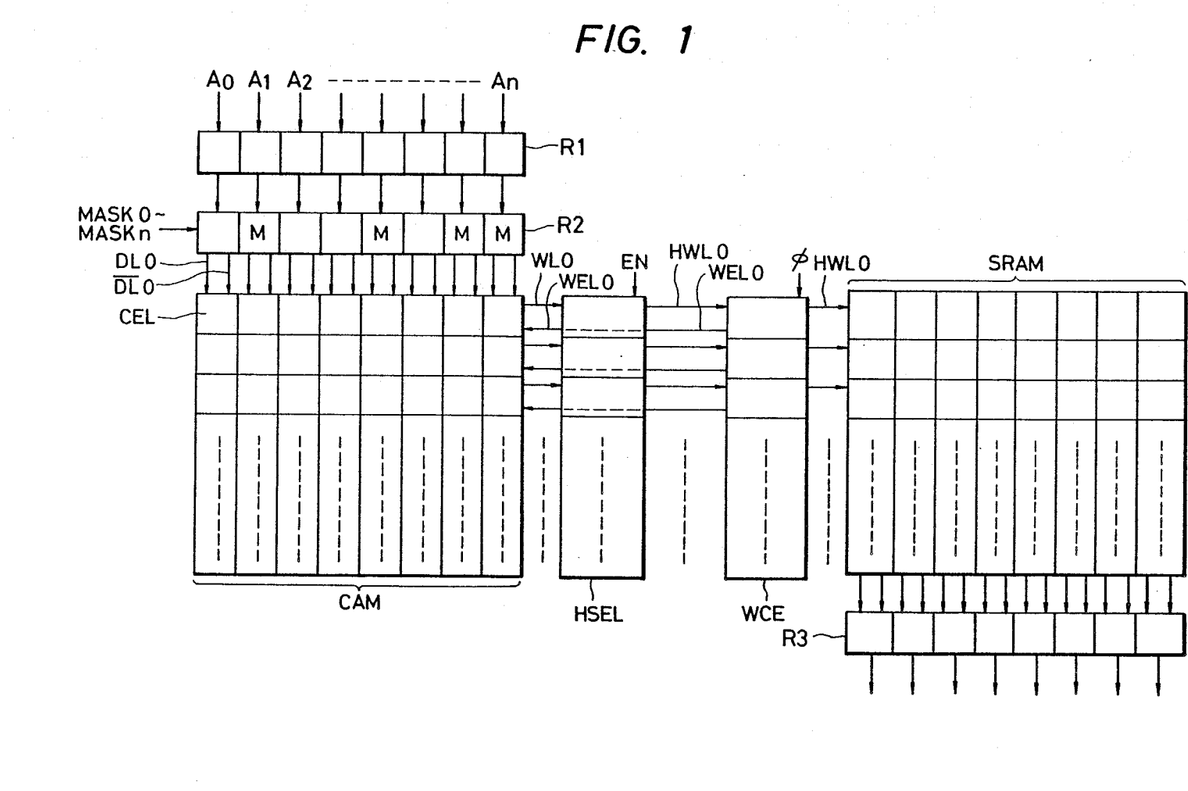
FIG. 1 is a block diagram of an associative memory employing one embodiment of the content-addressed memory according to the present invention.

FIG. 1 is block diagram of an associative memory to which one embodiment of the content-addressed memory according to the present invention is applied.

The circuit blocks shown in FIG. 1 are fabricated by a known MOS integrated circuit manufacturing technique on a single semiconductor substrate, such as a single crystal silicon chip although this is not essential to the present invention.

Input data consisting of plurality of bits $A_0$ to $A_n$ is set into an input (inquiry) register R1. Each of the bit output signals from the input register R1 is supplied to a mask register R2, which converts each signal to a pair of complementary signals on a pair of complementary data lines DL and $\overline{DL}$ extending to a memory array CAM of a content-addressed memory. The mask register R2 is adapted to virtually invalidate verification of any bit applied to a stage thereof having M affixed thereto, as described later. For example, both the complementary output signals of a stage with M applied thereto are brought to a low level irrespective of the input data. Thus, a coincidence output is obtained at all times through logical comparison between the input data and the data stored in a memory cell in the content-addressed memory corresponding to the input data, as will be described in more detail hereinafter.

The memory array CAM consists of a plurality of memory cells CEL having both storage and logical comparison functions, which cells are arranged in a matrix form. For example, a number of memory cells equal to the number of bits of the register R1 are disposed in each of the rows, and a number of memory cells equal to the maximum number of keys which can be stored are disposed in each of the columns.

Figure 2:
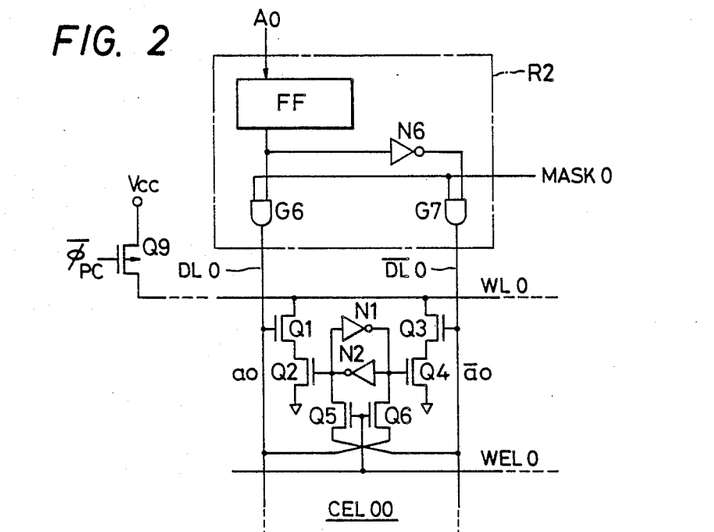
FIG. 2 is a circuit diagram of one example of cells constituting the content-addressed memory.

FIG. 2 shows a practical circuit configuration of each memory cell CEL. A memory cell CEL00 which is disposed at the intersection between a pair of complementary data lines DL0, $\overline{DL0}$ and a word line WL0 is representatively shown in FIG. 2. The storage function of the memory cell is realized by a flip-flop circuit constituted by two CMOS inverters N1 and N2 which are cross-coupled together.

The logical comparison function of the memory cell is realized by MOSFET's Q1, Q2 and MOSFET's Q3, Q4 which are respectively series-connected between the word line WL0 and the circuit ground potential. More specifically, the gates of the MOSFET's Q2 and Q4 are respectively supplied with a pair of complementary output signals from the flip-flop circuit, and the gates of the MOSFET's Q1 and Q2 are respectively supplied with complementary input signals A0 and $\overline{A0}$ which are supplied from the mask register R2 through the complementary data lines DL0 and $\overline{DL0}$, respectively.

To enable data to be written into the flip-flop circuit, write MOSFET's Q5 and Q6 are respectively provided between a pair of input/output terminals of the flip-flop circuit and the pair of complementary data lines DL0 and $\overline{DL0}$. More specifically, the MOSFET Q5 (Q6) is provided between the gate of the MOSFET Q2 (Q4) corresponding to one complementary data line DL0 ($\overline{DL0}$) and the other complementary data line DL0 ($\overline{DL0}$). The gates of the write MOSFET's Q5 and Q6 are connected to a write enable signal line WEL0. The word lines WL and the write enable signal lines WEL are disposed in correspondence with the rows of the memory array CAM shown in FIG. 1, and the complementary data lines DL and $\overline{DL}$ are disposed in correspondence with the columns of the memory array CAM.

A precharge circuit (or load resistance) is provided at one end of each of the word lines WL. More specifically, a P-channel MOSFET Q9 supplied at the gate thereof with a precharge signal $\phi PC$ is provided between the power supply Vcc and each word line. Prior to the operation of reading out the contents of the memory cells in the memory array CAM, each of the word lines WL is precharged by the MOSFET Q9.

A unit circuit which constitutes one stage of the mask register R2 is, as shown in FIG. 2, composed of flip-flop FF, together with CMOS AND gates G6, G7 and a CMOS inverter N6 for realizing a mask function. An input signal $A_0$ input to the register R1 is in turn input directly to the flip-flop FF in the register R2 and held therein. An output signal a0 from the flip-flop FF which is in-phase with the input signal $A_0$ is input to both the gate G6 and the inverter N6. An output signal $\overline{a0}$ from the inverter N6 is input to the gate G7. One input terminal of each of the gates G6 and G7 is connected to receive a mask signal MASK0 for invalidating the signal a0 and $\overline{a0}$ of the bit concerned. The low level of the mask signal is the register R2 shown in FIG. 1. In consequence, both the complementary input signals from each masked stage M are set to the low level.

Each of the memory cells constituting the content-addressed memory operates as follows. For example, when the non-inverting input signal a0 is raised to the high level, the inverting input signal $\overline{a0}$ is shifted to the low level, and the write enable signal line WEL0 is raised to the high level by means to be described later, a writing operation is carried out to write the data into the flip-flop formed by gates N1 and N2. More particularly, the output of the inverter N1 is raised to the high level, and the output of the inverter N2 is shifted to the low level. In such a state wherein this input data has been written and held in the memory cell, the MOSFET's Q4 and Q2 which constitute in combination a logical comparator are ON and OFF, respectively.

In this state, if input data, such as a high-level input signal a0 and a low-level input signal $\overline{a0}$, which is the same data already stored in the cell, is supplied, MOSFET Q1 is turned ON, while the MOSFET Q3 is turned OFF. Accordingly, the word line WL is maintained at the high level, that is, the precharge level. This means that a coincident output appears on the word line WL. If, unlike the above-described stored data, the applied input signal a0 has the low level and the applied input signal $\overline{a0}$ has the high level, the word line WL is shifted to the low level through the MOSFET's Q3 and Q4, both of which are turned ON in this condition.

When all the memory cells which are connected to one word line WL produce coincident outputs as a result of the above-described logical comparison in each cell connected to that word line, the word line WL is maintained at the high level, that is, the precharge level. In other words, the word line WL is brought to the hit level. If the data applied to at least one memory cell is found to be not coincident with the data already stored in that cell as a result of the logical comparison, the word line WL is shifted to the low level through this memory cell. For a masked stage m, both the complementary input signals are brought to the low level. As a consequence, both the MOSFET's Q1 and Q3 are turned OFF, and the word line WL is therefore controlled in the same manner as that in the case of the above-described coincident state irrespective of the input data. In other words, the logical comparison is masked by the mask bit.

Referring back to FIG. 1, the signal output from each of the word lines WL in the memory array CAM defined by the memory cell matrix is supplied to a hit select circuit HSEL. The hit select circuit HSEL has a priority ranking circuit and an output select circuit (or multiplexer). The priority ranking circuit operates such that, when a plurality of word lines are brought to the hit level, one hit signal is output in accordance with a predetermined priority sequence. The output select circuit operates such that, when a control signal EN is at the high level, the output of the priority ranking circuit is output as it is, whereas, when the control signal EN is at the low level, hit signals from a plurality of word lines are output as they are.

Figure 3:
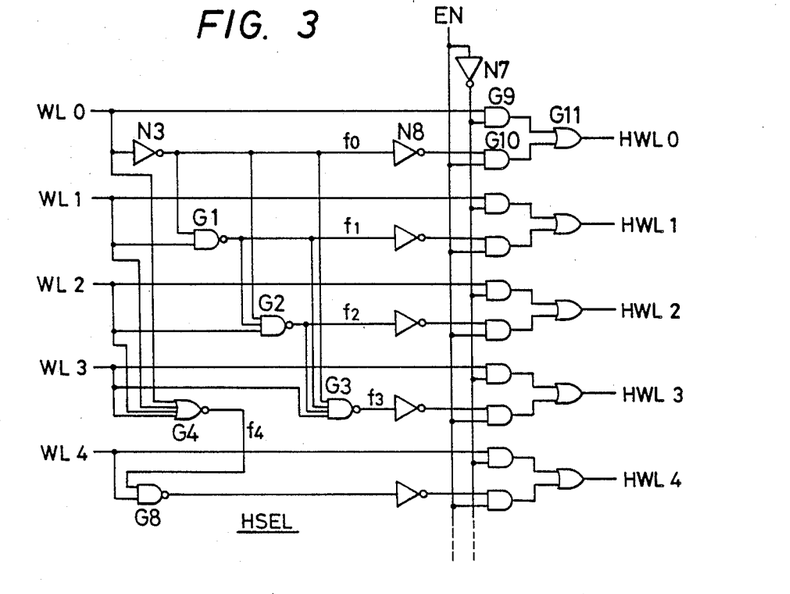
FIG. 3 is a circuit diagram of one example of a priority ranking circuit in the hit select circuit shown in FIG. 1.

FIG. 3 is a circuit diagram showing an essential part of one example of the hit select circuit HSEL.

In this embodiment, for example, priority is set in the following sequence: the word lines WL0→WL1→WL2→WL3. The priority ranking circuit corresponding to these four word lines WL0 to WL3 is composed of a CMOS inverter N3, and CMOS NAND gates G1, G2 and G3. The signal from the word line WL0 is inverted through the CMOS inverter N3 so as to become a select signal f0. The signal from the second-rank word line WL1 and the select signal f0 from the first-rank word line WL0 are supplied to the NAND gate G1. The output signal from this NAND gate G1 is defined as a second-rank select signal f1. The signal from the third-rank word line WL2 and the first-rank and second-rank select signals f0 and f1 are supplied to the NAND gate G2. The output signal from this NAND gate G2 is defined as a third-rank select signal f2. The signal from the fourth-rank word line WL3 and the first-rank, second-rank and third-rank select signals f0, f1 and f2 are supplied to the NAND gate G3. The output signal from this NAND gate G3 is defined as a fourth-rank select signal f3.

Each of the inverted signals of the outputs f0 to f3 of the priority ranking circuit and each of the from the word lines WL0 to WL3 are respectively supplied to first input terminals of CMOS AND gates G9, G10, etc. which constitute in combination the output select circuit. For example, the signal from the word line WL0 is input to the G9, and the select signal f0 which corresponds to the word line WL0 is by a CMOS inverter N8 and then input to the gate G10. The outputs of the gates G9 and G10 are supplied to a CMOS OR gate G11. The output of the gate G11 is supplied to memory array SRAM through a signal line HWL0 as a signal representing a hit word line in the memory array SRAM. Similarly, the signals from the word line WL1, WL2 and WL3 and the inverted signals of the select signals f1 to f3 which correspond thereto are respectively supplied to pairs of CMOS AND gates. The select signals f1 to f3 are respectively inverted by CMOS inverters similar to the inverter N8.

The output of each of the pairs of AND gates is input to a CMOS OR gate similar to the gate G11. The outputs of the OR gates are supplied to the memory array SRAM through signal lines HWL1 to HWLL3, respectively. A signal which is formed by inverting a control signal EN by a CMOS inverter N7 is supplied to the other or second input terminals of the AND gates G9 and the like in the output select circuit which respectively receive the signals from the word lines WL. The control signal EN is supplied to the other or second input terminals of the AND gates G10 and the like which respectively receive the select signals. In addition, the signals from the word lines WL0 to WL3 are supplied to a CMOS NOR gate G4. The output signal from the NOR gate G4 is defined as a group select signal f4 which represents that at least one hit signal is present in the group consisting of the four word lines.

The word lines in the memory array CAM are divided into a plurality of groups each consisting of four word lines, and a priority ranking circuit similar to the above-described one is provided for each of the groups. This priority ranking circuit is composed of CMOS AND gates (G8) provided in place of the inverter N3, and NAND gates G1 to G3. For each group, the select signal f4 is employed to designate the selection of a subsequent lower-rank group. For this purpose, the select signal f4 is supplied to a CMOS AND gate G8 in a group consisting of word lines WL4 to WL7, which is subsequent to and one rank lower than the group consisting of the word lines WL0 to WL3, the CMOS AND gate G8 in the subsequent group corresponding to the inverter N3 in the previous group. Similarly, the select signal f4 and a group select signal generated from the word lines WL4 to WL7 will be supplied to a CMOS AND gate in the group consisting of word lines WL8 to WL11.

Thus, it is possible to eliminate the limitation on the fan-in number with respect to the NAND gate employed, and prevent the operation speed from being slowed down, which would otherwise be caused by the fact that a select signal for word lines which are given relatively low priority ranks is formed by passing the signals from these word lines through a multiplicity of logical gate stages. More specifically, since a priority ranking circuit is provided for each of a plurality of groups, the priority rank of the four word lines for each group is simultaneously determined, and a hit signal for one word line is selected in accordance with the priority relationship between the groups.

The hit select circuit HSEL operates as follows.

For example, when the first-rank word line WL0 is raised to the high level which indicates a hit state, since the select signal f0 is at the low level (the logic "0" level), the output signals from the NAND gates G1 to G3 are raised to the high level (the logic "1" level) irrespective of the state of the signals from the corresponding word lines WL1 to WWL3, so that the signals from the word lines WL1 to WL3 are inhibited from being output when EN is at the high level. However, select signal f0 is inverted by the inverter N8 so as to have the high level and is output as a hit signal of the word line WL0 through gate G10 and gate G11. When the first-rank word line WL0 is shifted to the low level and the second-rank word line WL1 is raised to the high level, the output signal f1 from the NAND gate G1 is shifted to the low level. The select signal f1 is inverted and output as a hit signal of the word line WL1. Similarly, a hit signal on each of the succeeding word lines which have higher ranks than that particular word line are at the low level. Thus, hit signals generated on the basis of the contents of the memory array CAM are supplied to the output select circuit in accordance with the predetermined priority sequence.

When the control signal EN is raised to the high level, as described above, the signals from the word lines WL input to the gate circuits G9 and the like are invalidated. More specifically, even when a word line WL is at the high level which represents a hit state, the output of the gate G9 or the like is forced to be shifted to the low level. The inverted select signals f0 to f3 are respectively passed through the gates G10, G11 and the like and output to the signal lines HWL00 to HWL3 as they are. At this time, the priority ranking circuit causes only one of the signal lines HWL0 to HWL3 and the like to be raised to the high level which represents a hit state.

On the other hand, when the control signal EN is at the low level, the select signals f0 to f3 and the like are invalidated, and the signals from the word lines WL0 to WL3 and the like are respectively output to the signal lines HWL0 to HWL3 as they are. At this time, since the output of the priority ranking circuit is invalidated, a plurality of signal lines HWL may be brought to the high level at the same time to represent a hit state.

In FIG. 1, an output signal received from the hit select circuit HSEL is supplied to a write control circuit WCE, although this is not essential to the invention. This write control circuit WCE is composed of latch circuits for respectively storing the signals from the word lines in accordance with timing signals (signals) $\phi$ and $\bar{\phi}$, and is adapted to form write control signals in accordance with the output signals from the latch circuits, the write control signals being supplied to respective write enable lines WEL for controlling writing with respect to the memory array CAM.

Figure 4:
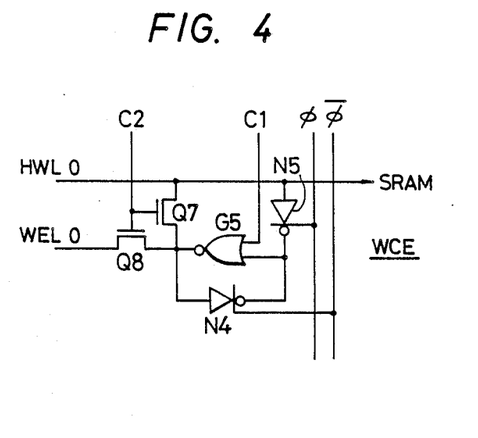
FIG. 4 is a circuit diagram of one example of unit circuits constituting the write control circuit shown in FIG. 1.

FIG. 4 is a circuit diagram of one example of unit circuits constituting the write control circuit WCE. The unit circuit is defined by a latch circuit which is composed of CMOS clocked inverters N4 and N5, a CMOS NOR gate G5 and transfer gate N-channel MOSFET's Q7 and Q8. The signal delivered from the signal line HWL0 through the hit select circuit HSEL is supplied to the input terminal of the clocked inverter N5, which is made operative by the timing signal $\phi$. The output signal from the clocked inverter N5 is supplied to one input terminal of the NOR gate G5. The output signal from the NOR gate G5 is fed back to the first input terminal thereof through the clocked inverter N4 for feedback, which is made operative by the inverted signal $\bar{\phi}$ of the clock signal $\phi$. The other input terminal of the NOR gate G5 is supplied with a timing signal C1, and the gates of the transfer gate MOSFET's Q7 and Q8 are supplied with a timing signal C2. The write control circuit WCE is made operative when the timing signal C1 is at the low level.

In response to the shift of the timing signal C1 to the low level, the NOR gate G5 is activated to operate practically as an inverter. Thus, when the clock signal $\phi$ is at the high level, the clocked inverter N5 is made operative, while the clocked inverter N4 is made inoperative, so that the signal from the signal line WHL0 is fetched to the first input terminal of the NOR gate G5. For example, when the signal from the signal line HWL0 indicates the high-level hit state (or the low level), a high level (or low-level) output signal is delivered from the NOR gate G5. When the clock signal $\phi$ is shifted to the low level (the inverted signal $\bar{\phi}$ is shifted to the high level) thereafter, the clocked inverter N5 is made inoperative, while the clocked inverter N4 is made operative, and the output signal from the signal line HWL0 is thereby held.

When the control signal EN is shifted to the low level, the timing signal C2 is raised to the high level appropriately after the signal EN has fallen. As a consequence, the MOSFET's Q7 and Q8 are turned ON, and the signal held by the latch circuit is output to the signal line HWL0 through the MOSFET Q7 as a signal for selecting a word line in the memory array SRAM, and is also output to the signal line WEL0 through the MOSFET Q8 as a write enable signal for the memory array CAM.

In the case where a high-level signal is held in the latch circuit constituting the write control circuit WCE, since the signal line WEL0 is raised to the high level, the MOSFET's Q5 and Q6 shown in FIG. 2 are turned ON. As a consequence, new data based on the level applied to the complementary data lines DL AND $\overline{DL}$ is written into memory cells in the memory array CAM which are connected to the signal line WEL0 at the timing when the MOSFET's Q5 and Q6 are turned ON. At this time, a hit word line in the static RAM memory array SRAM is also raised to the high level, and new data is written into the memory cells connected to the hit word line.

The timing signal C2 may, as a matter of course, be raised to the high level even when the control signal EN is at the high level.

The output of the hit select circuit HSEL is supplied to a word line driver (not shown) which is included in the static RAM memory array SRAM. The word line driver is made operative in response to a predetermined timing signal. Word lines in the memory array SRAM are disposed so as to extend horizontally as viewed in FIG. 1, while complementary data lines are disposed in the memory array SRAM so as to extend vertically as viewed in FIG. 1. Memory cells are respectively provided at the intersections between the word lines and the pairs of complementary data lines. Each of the memory cells in the memory array SRAM is constituted by a known static RAM. When a particular word line is raised to the high level which indicates a selection level, that is, when a particular signal line HWL is raised to the high level which indicates a hit level, a plurality of memory cells connected to that word line are selected.

In a read operation, the bits of data which are respectively stored in a plurality of memory cells connected to one word line are output in parallel to an output register R3 through the corresponding complementary data lines. The register R3 includes a known type of static RAM sense amplifiers and a read circuit. The bits of data respectively read out from the memory cells are amplified by the sense amplifiers and delivered from the read circuit.

In a write operation, data consisting of a plurality of bits is supplied through an input register (not shown) and written into a plurality of memory cells connected to a particular word line. For example, data which is associated with the key included in input data bits $A_0$ to $A_n$ as described above is written into one word in the memory array SRAM.

It should be noted that a write circuit for writing data into the register R3 may be provided. In addition, the hit select circuit HSEL may be provided with a driver for driving a word line in the memory array SRAM.

The following is description of the operation of the associative memory in accordance with this embodiment. For example, in initialization of the content-addressed memory, the control signal EN in the hit select circuit HSEL is shifted to the low level, whereby the select signal as the output of the priority ranking circuit is invalidated.

In this state, the mask signals MASK0 to MASKn are shifted to the low level so that all the bits applied to the mask register R2 are masked. In consequence, all the word lines in the memory array CAM which have been precharged to the high level in advance are held at the high level which indicates a hit state as described above. Then, the control signal C1 is raised to the high level to make the write control circuit WCE operative. The write control circuit WCE fetches the above-described hit signal in response to the clock signal $\phi$ and holds it in response to the clock signal $\bar{\phi}$. Thereafter, when the timing signal C2 is raised to the high level, all the write enable signal lines WEL in the memory array CAM are raised to the high level. Then, the mask signals MASK0 to MASKn are raised to the high level so as to cancel the masking of the mask register R2, and initial data is supplied from the register R1.

In consequence, the same initial data is written into all the words in the memory array CAM, thereby effecting an initializing (clearing) operation.

If any desired bits in the mask register R2 are masked, one or more bits in the initial data can be supplied to the memory array CAM. At this time, it is possible to set or clear only keys with a common bit pattern simultaneously with respect to all the words as described above. For example, in the case where the memory array CAM is used by a plurality of programs, if a flag which is assigned to each program is designated, it is possible to clear simultaneously only portions which are assigned to that program.

If the memory array, SRAM is selected in parallel with the above-described operation, all the word lines in the memory array SRAM are brought into a selective state, so that it is possible to simultaneously set (or clear) data supplied from the write register (not shown).

After the initialization, the following basic operation is appropriately repeated to effect reading of the memory array CAM, reading of the memory array SRAM based on this, or rewriting of data stored in the memory array CAM or SRAM. More specifically, a key (input data) is input, and a hit signal corresponding to this is obtained. A signal line HWL is raised to the high level in accordance with this hit signal so as to read or rewrite the data stored in the memory array SRAM. In addition, a control line WEL is raised to the high level in accordance with the hit signal so as to rewrite the data stored in the memory array CAM. These operations are effected by appropriately changing the mask bits and/or input data, that is, keys.

The operations effected by utilizing the hit select circuit HSEL include rewriting (key change) of the memory array CAM, and rewriting as well as reading of the memory array SRAM. In these operations, the control signal EN is raised to the high level so as to validate the output (select signal) of the priority ranking circuit in the hit select circuit HSEL.

The change of keys with respect to the memory array CAM is effected by using the write control circuit WCE in addition to the hit select circuit HSEL. More specifically, the data input to the input register R1 has any desired bits therein masked by the mask register R2 and is then supplied to the memory array CAM as a key. Word line WL to which are connected memory cells having the same contents as the key are allowed to maintain the high level which is a precharge level, that is, allowed to have a hit level. Among a plurality of word lines WL having the hit level, a word line WL having the highest priority rank is selected, and only one signal line which corresponds to this word line WL is brought to the hit level (high level). Then, the write control circuit WCE is activated by the signal $\phi$ ($\bar{\phi}$) and C1 so that the write enable signal line WEL in the memory array CAM which corresponds to the signal line HWL brought to the hit level is raised to the high level. In this state, a new key is input to the register R1. This new key is written into memory cells (corresponding bits among them) connected to a word line WL corresponding to the signal line HWL at the hit level. Then, if the key which has first been input is supplied again from the input register R1, a hit signal is obtained on a signal line HWL corresponding to a second priority rank word line WL. In consequence, a write enable signal line WEL in the memory array CAM corresponding to this signal line HWL is raised to the high level. If, in this state, a new key is supplied to the register R1, the bits constituting the new key are respectively written into corresponding memory cells connected to the second-rank word line WL. Thereafter, a plurality of different keys can be set in accordance with the priority sequence predetermined in the hit select circuit in a manner similar to the above. Even when a plurality of hit signals are output with respect to one key, key setting can be effected successively without destroying the contents of the memory array SRAM.

In the above-described operation, when one signal line HWL is brought to the hit level, a rewriting operation can be effected by activating the write register for the memory array SRAM. By this rewriting operation, data in the memory array SRAM which corresponds to the above-described key is changed. This operation can be effected without activating the write control circuit WCE.

Reading of data stored in the memory array SRAM, that is, data associated with an input key, is carried out by the hit select circuit HSEL. In a manner similar to the above, one signal line HWL is raised to the hit level in response to the input of a key. At this time, the sense amplifiers, the read circuit and the like within the register R3 are activated to read out the contents of the memory array SRAM. In this case, since a part of the input data is masked, a plurality of signals may be output. However, in this embodiment only one hit signal is output at all times by virtue of the operation of the priority ranking circuit in the hit select circuit HSEL as described above. In consequence, even when any desired bits of a key to be input are masked, one data item is read out in accordance with the predetermined priority sequence without any fear of a multiplicity of word lines in the memory array SRAM being selected simultaneously.

Rewriting (key change) of the memory array CAM can also be effected by the following operation in addition to the above-described operation carried out using the hit select circuit HSEL.

When the control signal EN is shifted to the low level, the output (select signal) from the priority ranking circuit is invalidated. As a consequence, a plurality of word lines WL are hit and raised to the high level with respect to one key, so that a plurality of signal lines HWL are raised to the high level (hit level). As a result, a multiplicity of word lines in the memory array SRAM are selected simultaneously. For this reason, when the control signal EN is shifted to the low level, any data read out to the register R3 is invalidated. On the other hand, the write control circuit WCE is activated so as to change keys in relation to the memory array CAM. More specifically, a plurality of signal lines WEL are raised to the high level, and a new key which has been given to the register R2 in advance is written into memory cells in the memory array CAM. Thus, any data having a key which has become unnecessary can be changed to data having a new key. The data in the memory array SRAM can also be rewritten at the same time.

According to the present invention, the following advantages are obtained.

(1) It is possible to allow one hit signal to be output with respect to an input keY at all times bY providing a hit select circuit which is adapted to output one hit signal in accordance with a predetermined priority sequence. Thus, in an associative memory, it is possible to prevent the destruction of data due to multiple selection of random-access memory locations into which data corresponding to the input key is written.

(2) It is possible to simultaneously take out a multiplicity of hit signals by arranging the priority ranking circuit in the hit select circuit so that the priority ranking circuit can be selectively operated. Accordingly, it is possible to efficiently effect overall clearing for, e.g., initialization, and partial clearing using a flag in the key.

(3) It is possible to efficiently carry out clearing of a content-addressed memory or a random-access memory, or replacement of keys (data) by providing a write control circuit which enables a memory cell in the content-addressed memory to be brought into a write enable state in accordance with a hit signal.

(4) By virtue of the operations of the priority ranking circuit in the hit select circuit and the write control circuit, it is possible to automatically effect key setting with respect to the content-addressed memory.

Although the invention accomplished by the present inventors has been practically described through one embodiment, the present invention is not necessarily limited to the above-described embodiment, and it is a matter of course that various changes and modifications may be imparted thereto without departing from the scope of the invention, which is limited solely by the appended claims.

For example, although the inverters N1 and N2 are constituted by CMOS inverters each composed of an N-channel MOSFET and a P-channel MOSFET in the above-described embodiment, various other forms may be adopted, e.g., a polysilicon layer having a relatively high resistance may be employed in place of the P-channel MOSFET. The circuit which makes a logical comparison between a signal from the storage unit and a signal supplied from the input register may adopt various forms in accordance with the required logical function. The priority ranking circuit and the output select circuit which are included in the hit select circuit and the write control circuit may have other types of practical arrangement. The registers R1, R2 and R3 may be constituted by various known circuits. The arrangement may be such that the register R1 is omitted, and input data is supplied directly to the input terminals of the register R2. Each priority ranking circuit may be constituted by a group of word lines each consisting of, for example, eight or sixteen word lines. In addition, the supply of the group select signal (f4) from a higher ranking group to a lower ranking group may be omitted.

In a system wherein no associative memory is provided, that is, where a hit signal is employed as an output signal, the memory array SRAM may be omitted.

The present invention can be widely utilized as a content-addressed memory. In addition, it is possible to widely apply the present invention to semiconductor memories or semiconductor integrated circuits having a content-addressed memory in a portion thereof.

What is claimed is:

1. A content-addressable memory formed on a semiconductor substrate comprising:
   a first memory array having a plurality of first lines, a plurality of data lines intersecting said first lines, and a plurality of memory cells respectively connected at the intersections between said first lines and said data lines in such a manner that said memory cells are arranged in the form of a matrix, each of said memory cells comprising means for storing data, means for effecting a comparison between input data and said stored data, and means for changing the potential of the first line to which said memory cell is connected in accordance with the result of said comparison; and
   hit select means connected to said first lines of said first memory array and responsive to a change in potential of a plurality of first lines for outputting a single hit signal corresponding to one of the first lines which has changed in potential and which has the highest rank in accordance with a predetermined ranking of said first lines.

2. An associative memory formed on a semiconductor substrate comprising:
   means for generating input data;
   a first memory coupled to receive said input data, said first memory including a plurality of storage sets each of which stores first data and includes means for comparing the input data with the first data stored therein and for generating a coincidence signal when the input data is coincident with the first data stored therein, and a first line to which the coincidence signal is applied;
   a memory array including a plurality of memory cells and a plurality of selecting lines each of which is coupled to the memory cells; and
   selecting means for selecting one of said plurality of selecting lines, said selecting means having inputs coupled to the first lines, respectively, and outputs coupled to said plurality of selecting lines, wherein said selecting means includes first means for selecting only one of said plurality of selecting lines in accordance with a predetermined rank of said first lines when said selecting means receives at said inputs a plurality of the coincidence signals on said first lines and for selecting one of said plurality of selecting lines in response to receipt of one coincidence signal on said first lines.

3. An associative memory according to claim 2, wherein said first means includes a plurality of blocks each of which is coupled to a predetermined number of the first lines, wherein each block has a predetermined rank different from each other, and wherein the respective first lines coupled to one block have a predetermined rank different from each other.

4. An associative memory according to claim 2, wherein said first means selects one selecting line from among said plurality of selecting lines of said memory array in response to one of said plurality of coincidence signals, and wherein said first means includes means for invalidating the others of said plurality of the coincidence signals by one of said plurality of the coincidence signals.

5. An associative memory formed on a semiconductor substrate comprising:
   means for generating input data;
   a first memory coupled to receive said input data, said first memory including a plurality of storage sets each of which stores first data and includes means for comparing the input data with the first data stored therein and for generating a coincidence signal when the input data is coincident with the first data stored therein, and a first line to which the coincidence signal is applied;
   a memory array including a plurality of memory cells and a plurality of selecting lines each of which is coupled to the memory cells; and
   selecting means for selecting one of said plurality of selecting lines, said selecting means having inputs coupled to the first lines, respectively, and outputs coupled to said plurality of selecting lines, wherein said selecting means includes first means for selecting only one of said plurality of selecting lines in accordance with a predetermined rank of said first lines when said selecting means receives at said inputs a plurality of the coincidence signals on said first lines and for selecting one of said plurality of selecting lines in response to receipt of one coincidence signal on said first lines, wherein said input data has a plurality of bits and said means for generating input data includes a first register in which said input data is set and a second register coupled to receive output signals of said first register and responsive to a control signal for invalidating at least one of the output signals supplied from said first register.

6. An associative memory according to claim 2, wherein each of said storage sets includes a plurality of memory cells each including a flip-flop, and wherein the memory cells of said memory array include a random access memory cell.

7. An associative memory formed on a semiconductor substrate, comprising:
  a first memory having a plurality of storage sets connected to receive and store input data, each storage set being connected to a respective one of a plurality of first lines and including means for comparing received input data with first data stored therein and for generating a coincidence signal on said one first line when said received input data is coincident with said stored first data;
  a memory array including a plurality of memory cells and a plurality of selecting lines each of which is coupled to a respective memory cell; and
  selecting means, coupled between said first memory and said memory array and responsive to a plurality of coincidence signals on said first lines for selecting a single one of said first lines on which a coincidence signal is received according to a priority ranking of said first lines and for applying a bit signal to a single one of said selecting lines according to the selected first line.

8. An associative memory according to claim 7, wherein said selecting means includes a plurality of inputs coupled to said first lines in accordance with said priority ranking of said first lines, a plurality of outputs coupled to respective selecting lines of said memory array, a plurality of gate means connecting respective inputs to respective outputs, and priority means connected to said gate means for enabling a single gate means connected to an input receiving coincidence signal from a first line of highest priority ranking among first lines carrying a coincidence signal and for inhibiting all gate means connected to first lines of lower priority rank.

9. An associative memory according to claim 8, wherein said gate means includes means responsive to a command signal for disabling said priority means so that all gate means are enabled which are connected to an input receiving a coincidence signal from a first lines.

* * * * *